United States Patent
Lin

(10) Patent No.: US 11,296,302 B2
(45) Date of Patent: Apr. 5, 2022

(54) FLEXIBLE DISPLAY PANEL, WITH PATTERNED ORGANIC ENCAPSULATION LAYER, FLEXIBLE DISPLAY DEVICE INCLUDING SAME, AND METHOD OF PREPARING FLEXIBLE DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventor: Min Lin, Wuhan (CN)

(*) Notice: Subject to any disclaimer, the term of this patent is extended or adjusted under 35 U.S.C. 154(b) by 422 days.

(21) Appl. No.: 16/344,025

(22) PCT Filed: Dec. 24, 2018

(86) PCT No.: PCT/CN2018/123071
§ 371 (c)(1),
(2) Date: Apr. 23, 2019

(87) PCT Pub. No.: WO2020/082565
PCT Pub. Date: Apr. 30, 2020

(65) Prior Publication Data
US 2021/0336202 A1    Oct. 28, 2021

(30) Foreign Application Priority Data
Oct. 26, 2018   (CN) .......................... 201811255996.5

(51) Int. Cl.
*H01L 29/08* (2006.01)
*H01L 51/52* (2006.01)
*H01L 51/56* (2006.01)
*H01L 27/32* (2006.01)
*H01L 51/00* (2006.01)

(52) U.S. Cl.
CPC .......... *H01L 51/5253* (2013.01); *H01L 51/56* (2013.01); *H01L 27/3244* (2013.01); *H01L 51/0097* (2013.01); *H01L 2227/323* (2013.01); *H01L 2251/5338* (2013.01)

(58) Field of Classification Search
CPC ........................... H01L 51/5253; H01L 51/56
See application file for complete search history.

(56) References Cited

U.S. PATENT DOCUMENTS

| | | | | |
|---|---|---|---|---|
| 10,637,007 B1* | 4/2020 | Wang | ................... | H01L 51/0097 |
| 10,707,289 B2* | 7/2020 | Li | ................. | H01L 51/0097 |
| 10,892,311 B2* | 1/2021 | Cao | .................... | H01L 27/3276 |
| 10,936,096 B2* | 3/2021 | Bai | ........................ | G06F 3/041 |
| 10,950,670 B2* | 3/2021 | Luo | .................... | H01L 51/0096 |
| 11,005,069 B2* | 5/2021 | Li | ........................ | H01L 51/5253 |
| 11,011,729 B2* | 5/2021 | Wang | ................. | H01L 51/0097 |
| 11,029,546 B2* | 6/2021 | Wang | ................ | G02F 1/133305 |
| 11,049,914 B2* | 6/2021 | Li | .......................... | G06F 1/1643 |

(Continued)

*Primary Examiner* — Caleb E Henry
(74) *Attorney, Agent, or Firm* — JMB Davis Ben-David

(57) ABSTRACT

The present invention discloses a flexible display panel, a flexible display device, and a method of preparing a flexible display panel. In the flexible display panel, a patterned design is formed on encapsulation layers at a bending area of the flexible display panel, thereby effectively alleviating stress of the flexible display panel during bending and solving problems of component failure caused by peeling-off or breakage of layers, and the chromaticity uniformity of the bending area can be improved.

10 Claims, 6 Drawing Sheets

(56) References Cited

U.S. PATENT DOCUMENTS

| | | | |
|---|---|---|---|
| 2007/0290201 A1* | 12/2007 | Hoffmann | H01L 51/5253 257/40 |
| 2012/0064318 A1* | 3/2012 | Keite-Telgenbuscher | B32B 27/08 428/216 |
| 2014/0106111 A1* | 4/2014 | Nam | G03F 7/027 428/76 |
| 2015/0001483 A1* | 1/2015 | Namkung | H01L 51/5268 257/40 |
| 2016/0126496 A1* | 5/2016 | Wang | H01L 51/5221 257/40 |
| 2017/0229674 A1* | 8/2017 | Jin | H01L 51/0097 |
| 2018/0062090 A1* | 3/2018 | Kim | H01L 51/0097 |
| 2018/0175311 A1* | 6/2018 | Jin | H01L 27/3258 |
| 2018/0342707 A1* | 11/2018 | Lee | H01L 27/3279 |

\* cited by examiner

FLEXIBLE DISPLAY PANEL, WITH PATTERNED ORGANIC ENCAPSULATION LAYER, FLEXIBLE DISPLAY DEVICE INCLUDING SAME, AND METHOD OF PREPARING FLEXIBLE DISPLAY PANEL

CROSS-REFERENCE TO RELATED APPLICATIONS

This is the U.S. National Stage of International Patent Application No. PCT/CN2018/123071, filed Dec. 24, 2018, which in turn claims the benefit of Chinese Patent Application No. 201811255996.5 filed Oct. 26, 2018.

BACKGROUND OF INVENTION

Field of Invention

The present invention relates to the field of liquid crystal display technologies, and in particular to a flexible display panel, a flexible display device, and a method of preparing the flexible display panel.

Description of Prior Art

An organic light emitting diode (OLED) has advantages of high contrast, fast response speed, self-illumination, a wide temperature range, etc., so it has gradually become a favorite of a small-size display industry. However, as people's requirements for products continue to increase, these characteristics can no longer meet demands. Liquid crystal display/quantum dot light emitting diode (LCD/QLED) technology is also making progress, which brings many challenges to a development of an OLED. Compared with other display technologies, it is easier for OLEDs to achieve flexible display, which is currently difficult by other technologies. Therefore, the development of flexible OLED technology is urgent. A biggest challenge of a flexible OLED is that each layer and other layers on a display element are not peeled off from each other during bending or folding. Once the layer peeling occurs, an organic material and an active electrode in the OLED display device is soon oxidized, thus forming dark spots that are gradually expanding. Therefore, stress and adhesion of the layers are crucial.

US Patent Publication No. US20160028043 discloses a stretchable thin film package structure. As shown in FIG. 1, a transistor Q and an organic light emitting diode 70 constitute an OLED light emitting unit, and the element represented by reference numeral 200 is an organic encapsulation layer. The organic encapsulation layer covers light-emitting regions, and is disconnected between the light-emitting regions. A first inorganic layer 310 is above the organic encapsulation layer 200, and this inorganic layer is discontinuous and encapsulates the organic encapsulation layer 200. A second inorganic encapsulation layer 320 is above the first inorganic layer 310, and this inorganic layer is discontinuous and encapsulates the first inorganic layer 310. A third inorganic layer 330 is above the second inorganic encapsulation layer 320, and the third inorganic layer 330 is a continuous layer enclosing all layers thereunder. Such a manner of thin film encapsulation is to form a concave pattern in a discontinuous area, but if there is foreign matter in the position of the concave pattern, this manner of thin film encapsulation is liable to cause package failure.

US Patent Publication No. US20150144921 to LG Corporation discloses a curved OLED structure as shown in FIG. 2. Reference numeral 100 in the drawing denotes a flexible substrate. Reference numeral 200 denotes a thin film transistor. Reference numeral 300 denotes an organic emission laver. Reference numeral 400 denotes a thin film encapsulation layer. Reference numeral 500 denotes a polarized layer, and reference numeral 600 denotes an outer cover. At a bending area 2AA, the element denoted by reference numeral 500 is removed, such that the thickness can be reduced while increasing bending characteristics, but the chromaticity of the display area 2AA is significantly different from the chromaticity of an area 1AA or an area 3AA, resulting in uneven chromaticity.

U.S. Pat. No. 2,952,395 to Samsung Corporation discloses an isolated thin film encapsulating structure as shown in FIG. 3. Reference numeral 231 denotes a first electrode. Reference numeral 233 denotes a light-emitting layer basic unit of the OLED. Reference numeral 235 denotes a second electrode. Reference numeral 311 denotes a first inorganic encapsulation layer in an island-separated form, and the first inorganic encapsulation layer covers the OLED light-emitting element. Reference numeral 313 denotes a second inorganic encapsulation layer and covers the first inorganic encapsulation layer. Such a structure can effectively prevent the diffusion of defects of the encapsulation layers, but this structure does not completely protect the organic layer and is prone to fail.

In addition, U.S. Pat. No. 2,952,395 to Samsung Corporation discloses a curved OLED design as shown in FIG. 4, in which a recess in a triangular shape or other shapes is formed in the flexible substrate 100, such that stress on the flexible substrate 100 will be significantly reduced during inner bending, but this design will concentrate the stress on a third layer thin-film transistor (TFT), which will bring a risk of breakage.

In view of the above, it is necessary to provide a flexible display panel to solve the above problems.

SUMMARY OF INVENTION

An object of the present invention is to provide a flexible display panel, wherein a patterned design is formed on encapsulation layers at a bending area of the flexible display panel, thereby effectively alleviating a stress of the flexible display panel during bending and solving problems of component failure caused by peeling-off or breakage of layers, and the chromaticity uniformity of the bending area can be improved.

In order to solve the above problems, the present invention provides a flexible display panel including: a flexible substrate; a thin film transistor array on the flexible substrate; a pixel isolation layer on the thin film transistor array; an organic light emitting layer on the pixel isolation layer; and a thin film encapsulation layer on the organic light emitting layer, wherein the thin film encapsulation layer includes a first inorganic encapsulation layer, an organic encapsulation layer, and a second inorganic encapsulation layer sequentially stacked in a direction away from the flexible substrate, wherein the organic encapsulation layer includes a first organic encapsulation layer and a second organic encapsulation layer; and wherein a light emitting unit is disposed in the organic light emitting layer, and the flexible display panel further including: at least one bending area and a planar region, wherein the first organic encapsulation layer is disposed in the bending area and corresponds to the light emitting unit, while the second organic encapsulation layer is disposed in the bending area and the planar region and covers the first organic encapsulation layer, wherein a cross section of the first organic encapsulation layer disposed in the bending area has a regular shape which is vertically symmetrical.

In an embodiment of the invention, the cross section of the first organic encapsulation layer is of one of a regular hexagon, a regular octagon, a circle, an ellipse, and a diamond.

In an embodiment of the invention, an elastic modulus of the first organic encapsulation layer is less than or equal to an elastic modulus of the second organic encapsulation layer.

In an embodiment of the invention, the organic encapsulation layer further includes a third organic encapsulation layer disposed in the planar region, and the second inorganic encapsulation layer covers the third organic encapsulation layer, wherein a material of the third organic encapsulation layer is different from a material of the first organic encapsulation layer, and the elastic modulus of the third organic encapsulation layer is greater than the elastic modulus of the first organic encapsulation layer.

In an embodiment of the invention, the first organic encapsulation layer and the second organic encapsulation layer are made of a same material.

In an embodiment of the invention, the first organic encapsulation layer and the second organic encapsulation layer are made of one of an acrylic series, an epoxy series and a silicone series.

In an embodiment of the invention, the first organic encapsulation layers respectively corresponding to two adjacent ones of the light emitting units are connected to each other.

In an embodiment of the invention, the first inorganic encapsulation layer has a thickness ranging from 0.5 micrometers to 1.5 micrometers.

In addition, the present invention also provides a flexible display device including the flexible display panel.

Furthermore, the present invention also provides a method of preparing a flexible display panel, including the following steps: (a) providing a flexible substrate; (b) forming a thin film transistor array on the flexible substrate; (c) forming a pixel defining layer on the thin film transistor array; (d) forming an organic light-emitting layer on the pixel defining layer; (e) depositing and forming a first inorganic encapsulation layer on the organic light-emitting layer; (f) forming a first organic encapsulation layer on the first inorganic encapsulation layer, and patterning the first organic encapsulation layer, wherein the patterned first organic encapsulation layer is disposed at a bending area of the flexible display panel corresponding to a light emitting unit, wherein the flexible display panel includes the organic light emitting layer, and the light emitting unit is disposed in the organic light emitting layer; (g) covering the patterned first organic encapsulation layer and the exposed first inorganic encapsulation layer by a second organic encapsulation layer; and (h) depositing and forming a second inorganic encapsulation layer on the second organic encapsulation layer.

An advantage of the present invention is that in the flexible display panel of the present invention, a patterned design is formed on encapsulation layers at a bending area of the flexible display panel, and is distributed in pairs with the pixels, thereby effectively alleviating a stress of the encapsulation layers and the OLED light emitting layer during bending, to effectively improve the reliability of the flexible display device and improve the chromaticity uniformity of the bending area.

BRIEF DESCRIPTION OF DRAWINGS

In order to more clearly illustrate the embodiments or the technical solutions of the existing art, the drawings illustrating the embodiments or the existing art will be briefly described below Obviously, the drawings in the following description merely illustrate some embodiments of the present invention. Other drawings may also be obtained by those skilled in the art according to these figures without paying creative work.

DETAILED DESCRIPTION OF PREFERRED EMBODIMENTS

The terms "first", "second", "third", etc. (if present) in the specification and claims of the present invention and the above figures are used to distinguish similar objects, and are not necessarily used to describe a specific order or prioritization. It should be understood that the objects so described are interchangeable when it is appropriate. Moreover, the terms "including" and "having" and any variations thereof are intended to cover a non-exclusive "inclusion".

Reference throughout this specification to "one embodiment" or "an embodiment" means that a particular feature, structure, or characteristic described in conjunction with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. The spatially relative terms are intended to encompass different orientations in addition to the orientation as depicted in the figures.

The terminology used herein is for the purpose of describing particular embodiments only and is not intended to be limiting of exemplary embodiments. The singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, components and/or groups thereof, but do not preclude the presence or addition of one or more other features, integers, steps, operations, elements, components and/or groups thereof.

Embodiments of the present invention provide a flexible display panel, a method of preparing the same, and a flexible display device. The details will be described below.

Figure 1:
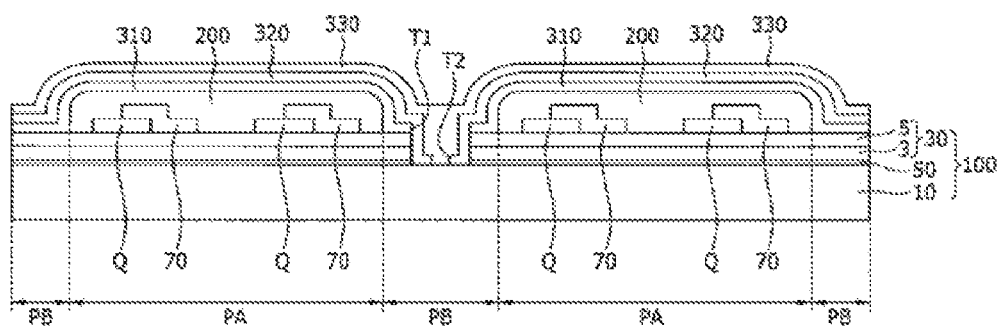
FIG. 1 is a schematic view of a figure in the prior art, US20160028043.
Figure 2:
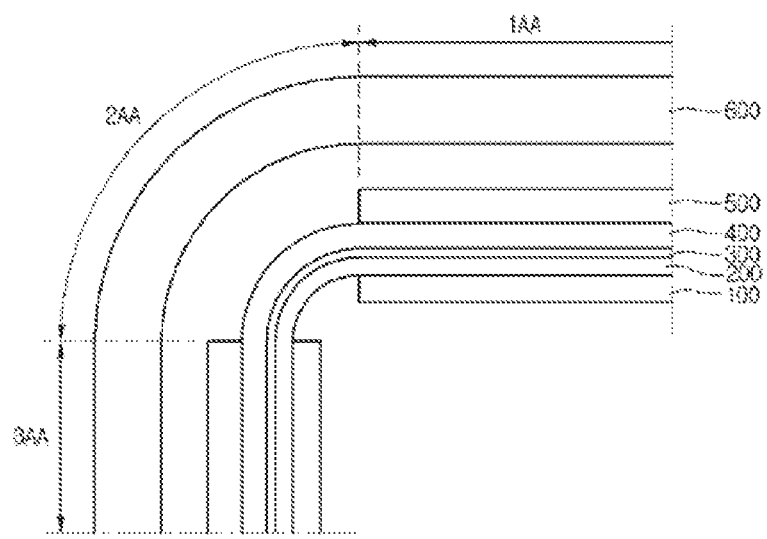
FIG. 2 is a schematic view of a figure in the prior art, US20150144921.
Figure 3:
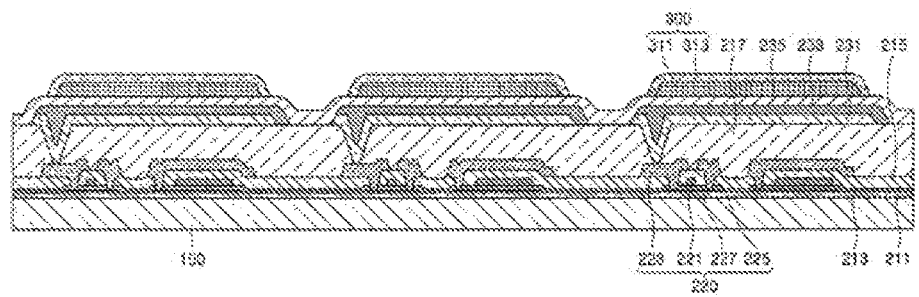
FIG. 3 is a schematic view of a figure in the prior art, U.S. Pat. No. 9,252,395.
Figure 4:
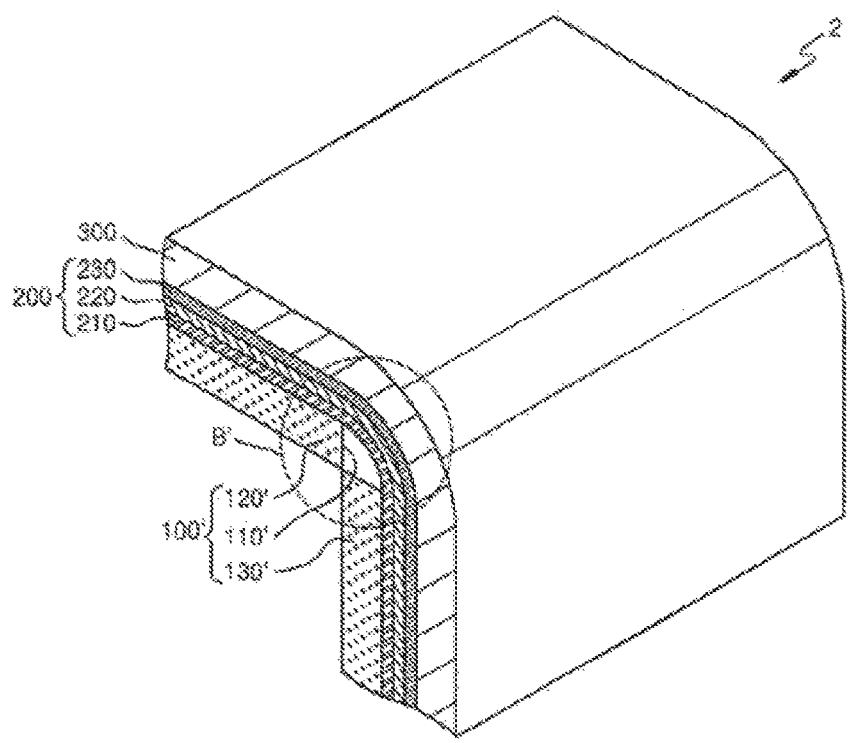
FIG. 4 is a schematic view of a figure in the prior art, US20160099433.
Figure 5:
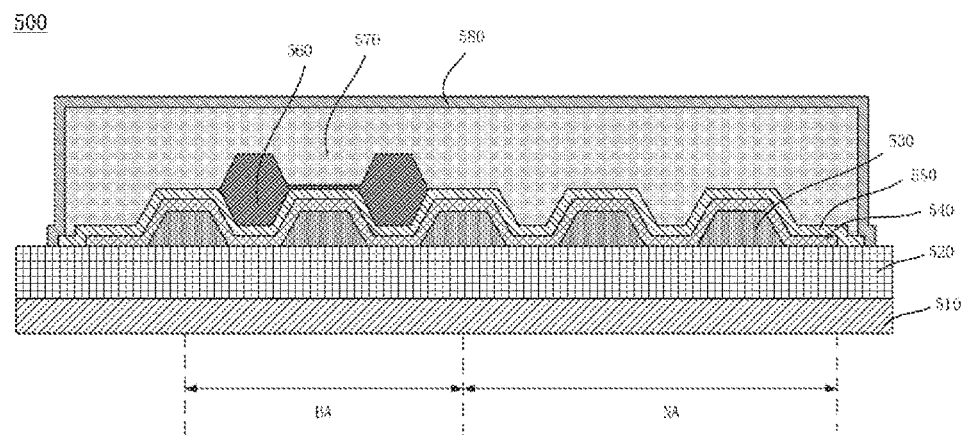
FIG. 5 is a schematic structural diagram of a flexible display panel according to an embodiment of the present invention.

Referring to FIG. 5, the present invention provides a flexible display panel 500 that can be integrated into a flexible display device, such as a cell phone, a television, a tablet, and the like.

The flexible display panel 500 includes a flexible substrate 510, a thin film transistor array 520, a pixel isolation layer 530, an organic light emitting layer 540, and a thin film encapsulation layer (not labeled).

The flexible substrate 510 may be made of polyvinyl alcohol, polyimide, polyester, or the like.

The thin film transistor array 520 is above the flexible substrate 510. The structure of the thin film transistor array 520 is well known to those skilled in the art, and may include a layer, such as an active layer, a gate insulating layer, a gate electrode, a passivation layer, a source drain, and the like, but is not limited thereto.

The pixel isolation layer 530 is formed on the thin film transistor array 520. The pixel isolation layer 530 is referred to as a pixel definition layer (PDL) for isolating three R/G/B sub-pixels in the display panel to avoid mutual influences between pixels.

The organic light emitting layer 540 is located above the pixel isolation layer 530. In the embodiment, the organic light emitting layer 540 includes a hole injection layer, a hole transport layer, an electron blocking layer, a light emitting unit, an electron transport layer, an electron injection layer, a cathode, a capping layer, and a lithium fluoride (LiF) layer.

The thin film encapsulation layer (not labeled in the figure) is located above the organic light emitting layer 540. The thin film encapsulation layer includes a stack of an inorganic encapsulation layer and an organic encapsulation layer. The flexible display panel 500 includes at least one bending area BA and at least one planar region NA.

In this embodiment, along a direction away from the flexible substrate 510, the thin film encapsulation layer further includes a first inorganic encapsulation layer 550, an organic encapsulation layer (not labeled) and a second inorganic encapsulation layer 580 which are sequentially stacked. The organic encapsulation layer includes a first organic encapsulation layer 560 and a second organic encapsulation layer 570. The first organic encapsulation layer 560 is disposed in the bending area (i.e., BA) and corresponds to the light emitting unit in the organic light emitting layer 540. The second organic encapsulation layer 570 is disposed at the bending area BA and the planar region NA, and the second organic encapsulation layer 570 covers the first organic encapsulation layer 560.

A cross section of the first organic encapsulation layer disposed in the bending area has a regular shape which is vertically symmetrical. The cross section of the first organic encapsulation layer may be one of a regular hexagon, a regular octagon, a circle, an ellipse, and a diamond. In this embodiment, the first organic encapsulation layer has a regular hexagonal cross section. Because the cross section of the first organic encapsulation layer 560 has the above-described vertically symmetrical shape, it helps the first organic encapsulation layer 560 to have good ductility. When the bending area BA of the flexible display panel 500 is bent by an external force, the first organic encapsulation layer 560 has good ductility, so that the failure of the encapsulation layer can be avoided, thereby effectively improving the reliability of the bending area. In addition, the regular hexagonal cross section of the first organic encapsulation layer 560 is designed according to actual production conditions to make it easier to form the desired first organic encapsulation layer 560.

Because the cross section of the first organic encapsulation layer 560 has a regular shape which is vertically symmetrical, and the first organic encapsulation layer 560 is disposed at a position corresponding to the light emitting unit in the organic light emitting layer 540, a chromaticity uniformity of the bending area can be effectively improved. Therefore, the problem existing in the prior art can be solved, that is, when the display panel is bent, the phenomenon of chromaticity unevenness is likely to occur, such as in US20150144921 described in the background of the present specification.

In addition, in the flexible display panel 500 provided by this embodiment, the first organic sealing layer 560 is disposed in the bending area BA of the flexible display panel 500 and corresponds to the light emitting unit in the organic light emitting layer 540. The second organic encapsulation layer 570 is disposed in the bending area BA and the planar region NA, and the second organic encapsulation layer 570 covers the first organic encapsulation layer 560. The first organic encapsulation layer 560 has an elastic modulus less than an elastic modulus of the second organic encapsulation layer 570. When the flexible display panel 500 is bent, because the elastic modulus of the second organic encapsulation layer 570 is larger, the second organic encapsulation layer 570 is easily extended, thereby avoiding package failure in the prior art at a position where a pattern is formed in a discontinuous region, and the durability of the flexible display panel 500 is further improved. It should be noted that the elastic modulus herein refers to the Young's modulus.

In addition, the elastic modulus of the first organic encapsulation layer 560 may also be equal to the elastic modulus of the second organic encapsulation layer 570. In such a case, material of the first organic encapsulation layer 560 and material of the second organic encapsulation layer 570 are the same.

The cross section of the first organic encapsulation layer 560 is the regular hexagon, and the first organic encapsulation layers 560 respectively corresponding to the two adjacent light emitting units are connected to each other, thereby facilitating the diffusion and transfer of stress between the two adjacent first organic encapsulation layers 560 to effectively solves the problem of stress concentration on a certain layer which may cause cracking of the layer in the prior art, such as US20160099433, described in the background of the present specification.

Furthermore, the first inorganic encapsulation layer 550 and the second inorganic encapsulation layer 580 in the thin film encapsulation layer may be formed by vacuum evaporation, ion beam sputtering, chemical vapor deposition, or the like. The manner of forming the first inorganic encapsulation layer 550 and the second inorganic encapsulation layer 580 in this embodiment is not limited. Optionally, the first inorganic encapsulation layer 550 has a thickness of 0.5 μm to 1.5 μm, and the first inorganic encapsulation layer 550 is made of one of SiNx, SiOx, SiONx, SiCNx, Al2O3, TiO2, ZrO2, the like, and combinations thereof. Material of the second inorganic encapsulation layer 580 may be the same as material of the first inorganic encapsulation layer 550 or any one of the above materials and combinations thereof. It should be noted that, in this embodiment, the second inorganic encapsulation layer 580 completely covers the first inorganic encapsulation layer 550 and the organic layers, thereby effectively preventing diffusion of the organic layers and the first inorganic encapsulation layer 550, and relieving the stress. As such, the condition that an island-shaped inorganic encapsulation layer does not completely protect the organic layers in U.S. Pat. No. 9,252,395 as described in the background of the present specification, can be avoided.

The first organic encapsulation layer 560 and the second organic encapsulation layer 570 in the thin film encapsulation layer may function as a buffer to reduce influences on the organic light emitting layer 540 induced by the sputtering force produced during forming the inorganic encapsulation layers and the stress of the inorganic encapsulation layers. The first organic encapsulation layer 560 and the second organic encapsulation layer 570 in the thin film encapsulation layer may be formed by inkjet printing, screen printing, plasma enhanced vapor deposition (PECVD), or the like. The inkjet printing method, having advantages of fast deposition speed and good uniformity, has become a preferred method for the thin film packaging process. The material of the first organic encapsulation layer 560 and the second organic encapsulation layer 570 may be selected from one of an acrylic series, an epoxy series, and a silicone series.

The organic encapsulation layers serve to buffer the stress of the first inorganic encapsulation layer 550 and the second inorganic encapsulation layer 580, and cover the foreign matter inside of the flexible display panel 500 for planarization. Therefore, the organic encapsulation layers have a certain thickness, wherein the first organic encapsulation layer 560 has a thickness of 1-3 microns, and the second organic encapsulation layer 570 has a thickness of 4-16 microns. In addition, the organic encapsulation layers are required to have a thickness as small as possible during inkjet printing to ensure a good yield. Therefore, the thickness of the organic encapsulation layers is set within an appropriate range to ensure a buffering effect, a planarization effect, and the yield of the inkjet printing of the organic encapsulation layers at the bending area BA and to achieve an effect of bending.

Figure 6:
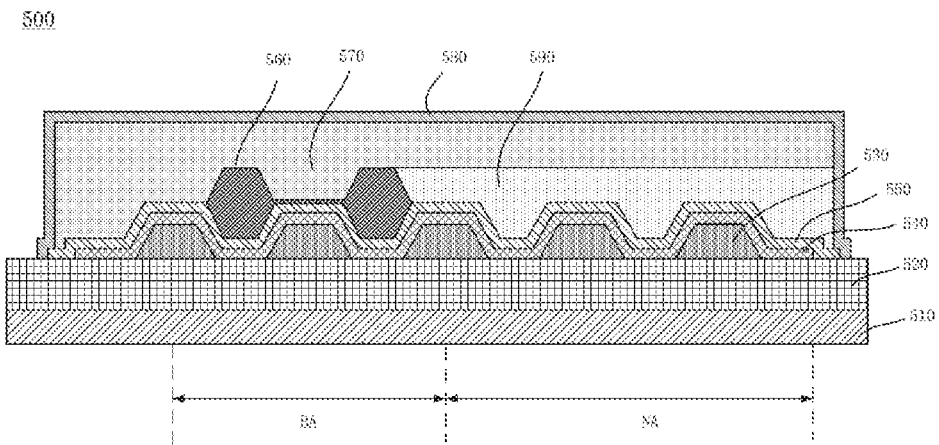
FIG. 6 is a schematic structural view of a flexible display panel according to another embodiment of the present invention.

Referring to FIG. 6, in another embodiment of the present invention, the organic encapsulation layers further include a third organic encapsulation layer 590. The third organic encapsulation layer 590 is disposed in the planar region NA and the second organic encapsulation layer 570 covering the third organic encapsulation layer 590. That is, the second organic encapsulation layer 570 covers the first organic encapsulation layer 560 in the bending area BA, while covering the third organic encapsulation layer 590 in the planar region NA. A thickness of the third organic encapsulation layer 590 is the same as a thickness of the first organic encapsulation layer 560.

The material of the third organic encapsulation layer 590 is different from the material of the first organic encapsulation layer 560, and an elastic modulus of the third organic encapsulation layer 590 is greater than the elastic modulus of the first organic encapsulation layer 560. Through the design of the structure, the flexible display panel 500 is more favorable for bending, and a layer breakage is not prone to occur when extended.

In this embodiment, the first organic encapsulation layer 560, the second organic encapsulation layer 570, and the third organic encapsulation layer 590 may be one of an acrylic series, an epoxy series, and a silicone series. The material of the first organic encapsulation layer 560 is different from the material of the third organic encapsulation layer 590, and may be the same as the material of the second organic encapsulation layer 570. Of course, the material of the first organic encapsulation layer 560, the second organic encapsulation layer 570, and the third organic encapsulation layer 590 may be different.

Figure 7:
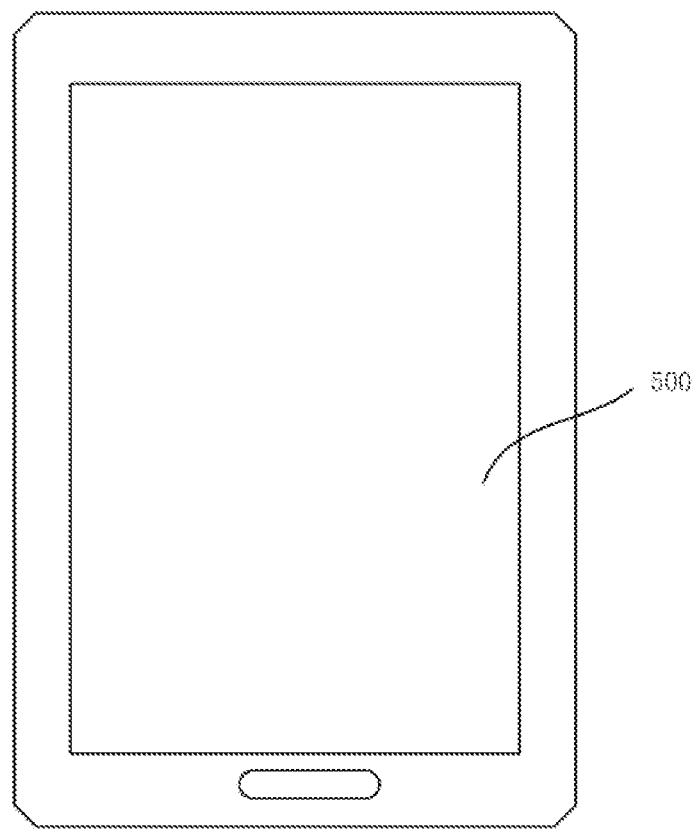
FIG. 7 is a schematic structural view of a flexible display device according to an embodiment of the present invention.
Figure 8:
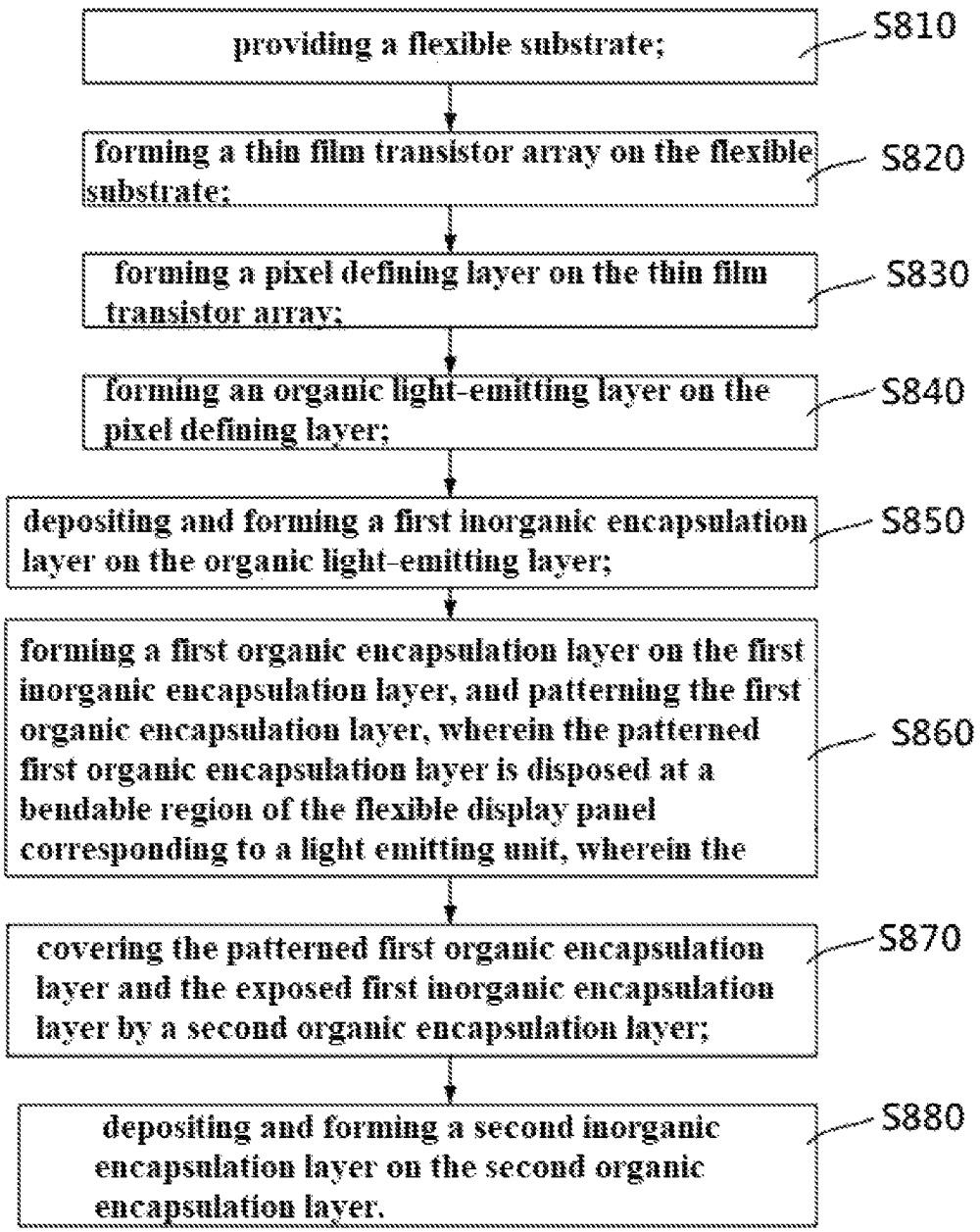
FIG. 8 is a flowchart showing the steps of a method of preparing a flexible display panel according to an embodiment of the present invention.

Referring to FIG. 7, the present invention further provides a flexible display device including the flexible display panel 500 according to any one of the above embodiments, and further including other components for supporting the flexible display device to operate normally. The flexible display device can be any product or component having a display function, such as a mobile phone, a television, a display, a digital photo frame, a navigator, and the like. Because the flexible display device provided by the embodiment adopts the above flexible display panel 500, the flexible display device also has the same advantageous effects as the above-described flexible display panel 500.

Figure 9A:
FIGS. 9A to 9H are process flow diagrams of a method of preparing a flexible display panel according to embodiments of the present invention.

Referring to FIG. 8 and FIG. 9A to FIG. 9H, the present invention further provides a method of preparing a flexible display panel, which includes the following steps:

Referring to FIG. 9A, step S810: providing a flexible substrate.

The flexible substrate 510 may be made of polyvinyl alcohol, polyimide, polyester, or the like.

Figure 9B:
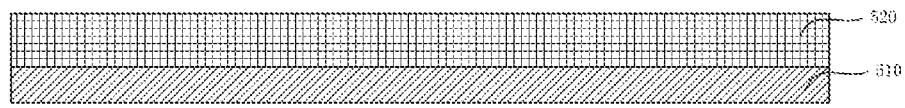

Referring to FIG. 9B, step S820: forming a thin film transistor array on the flexible substrate.

The thin film transistor array 520 is disposed on the flexible substrate 510. The thin film transistor array 520 can be formed in a manner well known to those skilled in the art. An amorphous silicon layer is formed on the substrate by plasma vapor deposition, and polysilicon is formed by Low-temperature polycrystalline silicon (LTPS) technology, and the polysilicon layer is patterned to form an active layer. Then, a first gate insulating layer is formed by a chemical vapor deposition (CVD) method, a second gate insulating layer is formed by plasma chemical vapor deposition, and a gate is formed on the second gate insulating layer. Next, a passivation layer is deposited and formed on a surface of the gate and an exposed surface of the second gate insulating layer by a PECVD method. A metal layer is then deposited by a physical vapor deposition (PVD) method to form a source and a drain. Further, a planarization layer may be formed on surfaces of the passivation layer, the source, and the drain.

Figure 9C:
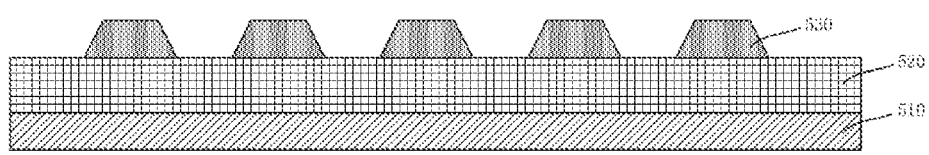

In conjunction with FIG. 9C, step S830: forming a pixel defining layer on the thin film transistor array.

After the thin film transistor array 520 is formed, a patterned pixel defining layer 530 can be formed thereon. A pixel isolation layer is referred to as a pixel definition layer for isolating three R/G/B sub-pixels in the display panel to avoid mutual influences between the pixels.

Figure 9D:
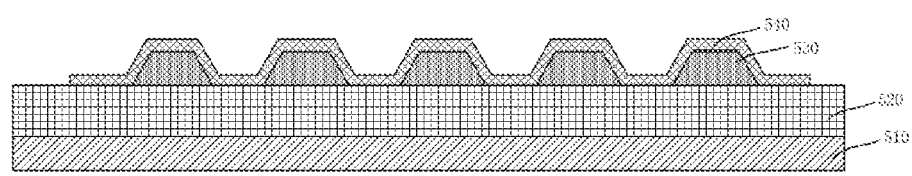

Referring to FIG. 9D, step S840: forming an organic light emitting layer on the pixel defining layer.

The organic light emitting layer 540 is formed on the pixel defining layer 530. The organic light emitting layer 540 is provided with a light emitting unit, and the light emitting unit is surrounded by the pixel defining layer 530.

Figure 9E:
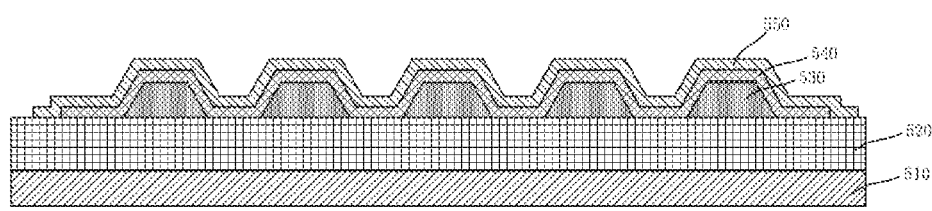

Referring to FIG. 9E, step S850: depositing and forming a first inorganic encapsulation layer on the organic light emitting layer.

In this embodiment, the first inorganic encapsulation layer 550 may be deposited and formed on the organic light emitting layer 540 by chemical vapor deposition. The first inorganic encapsulation layer 550 has a thickness of 0.5 μm to 1.5 μm, and the first inorganic encapsulation layer 550 is made of one of SiNx, SiOx, SiONx, SiCNx, Al2O3, TiO2, ZrO2, and combinations thereof.

In this step, a surface of the first inorganic encapsulation layer 550 is etched by a dry etching process, and a recess is formed at a position corresponding to the light-emitting unit, that is, the recess is formed at the position corresponding to a region of the pixels in the flexible display panel.

Figure 9F:
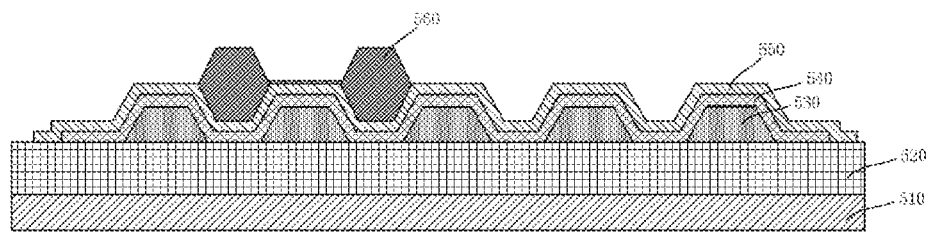

Referring to FIG. 9F, step S860: forming a first organic encapsulation layer on the first inorganic encapsulation layer, and patterning the first organic encapsulation layer, wherein the patterned first organic encapsulation layer is disposed at a bending area of the flexible display panel corresponding to the light emitting unit, and the flexible display panel includes the organic light emitting layer, and the light emitting unit is disposed in the organic light emitting layer.

The first organic encapsulation layer 560 is formed on the patterned first inorganic encapsulation layer 550 by inkjet printing, and patterned by imprinting to form the patterned first organic encapsulation layer 560 in the recess.

After the first organic encapsulation layer 560 is patterned, the cross section of the first organic encapsulation layer 560 located at the bending area is a regular vertically symmetrical shape. The cross section of the first organic encapsulation layer 560 may be one of a regular hexagon, a regular octagon, a circle, an ellipse and a diamond. In this embodiment, the cross section of the first organic encapsulation layer 560 is in a regular hexagonal shape.

Due to the patterning of the first organic encapsulation layer, the cross section of the first organic encapsulation layer 560 has a regular vertically symmetrical shape, helping the first organic encapsulation layer 560 to have good ductility. When the bending area of the flexible display panel is bent by an external force, the good ductility of the first organic encapsulation layer 560 prevents the failure induced in the encapsulation layer, thereby effectively improving the reliability of the bending area. In addition, the regular hexagonal cross section of the first organic encapsulation layer 560 is designed according to actual production conditions to make it easier to form the desired first organic encapsulation layer 560.

In addition, since the cross section of the first organic encapsulation layer 560 has a regular shape which is vertically symmetrical, and the first organic encapsulation layer 560 is disposed corresponding to the light emitting unit in the organic light emitting layer, and thus the chromaticity and efficiency at a border area of the flexible display panel can be improved, that is, the chromaticity uniformity of the bending area is effectively improved, thereby effectively solving the problems existing in the prior art and improving the uniformity of the entire flexible display panel.

Figure 9G:
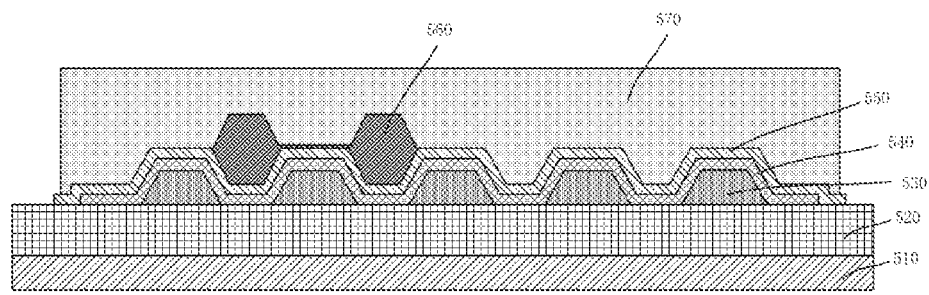

Referring to FIG. 9G, step S870: covering the patterned first organic encapsulation layer and the exposed first inorganic encapsulation layer by a second organic encapsulation layer 570.

The second organic encapsulation layer 570 covers the first organic encapsulation layer 560, and the second organic encapsulation layer 570 is formed at a bending area and a planar region of the flexible display panel. That is, the second organic encapsulation layer 570 is formed to cover the exposed surfaces of the first inorganic encapsulation layer 550 and the first organic encapsulation layer 560.

In this step, material of the first organic encapsulation layer 560 and the second organic encapsulation layer 570 may be the same or different. The first organic encapsulation layer 560 and the second organic encapsulation layer 570 may be made of one of an acrylic series, an epoxy series, and a silicone series.

When an elastic modulus of the first organic encapsulation layer 560 is smaller than an elastic modulus of the second organic encapsulation layer 570, the material of the first organic encapsulation layer 560 is different from the second organic encapsulation layer 570. When the flexible display panel is bent, because the elastic modulus of the second organic encapsulation layer 570 is larger, the second organic encapsulation layer 570 is easily extended, thereby avoiding package failure at a position where the pattern is formed in a discontinuous region in the prior art.

The elastic modulus of the first organic encapsulation layer 560 may also be equal to the elastic modulus of the second organic encapsulation layer 570. In such a case, the material of the first organic encapsulation layer 560 and the material of the second organic encapsulation layer 570 are the same. It should be noted that although the material of the first organic encapsulation layer 560 and the second organic encapsulation layer 570 is the same, the first organic encapsulation layer 560 and the second organic encapsulation layer 570 are formed by inkjet printing, such that the material changes from liquid to solid after inkjet printing, and a boundary is formed between the first organic encapsulation layer 560 and the second organic encapsulation layer 570.

Figure 9H:
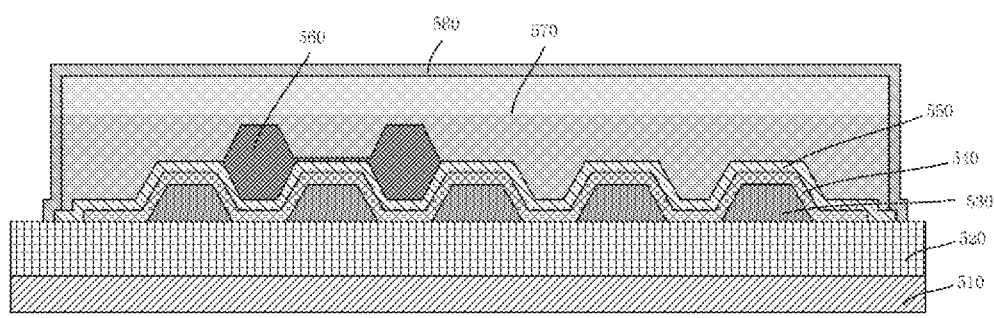

Referring to FIG. 9H, step S880: depositing and forming a second inorganic encapsulation layer on the second organic encapsulation layer.

A second inorganic encapsulation layer 580 is deposited and formed on the second organic encapsulation layer 570, and the second inorganic encapsulation layer 580 completely covers the first inorganic encapsulation layer 550, that is, the first inorganic encapsulation layer 550 is in sufficient contact with the second inorganic encapsulation layer 580 to further ensure encapsulation strength and effect.

In the flexible display panel of the present invention, a patterned design is formed on encapsulation layers at a bending area of the flexible display panel, and is distributed in pairs with the pixels, thereby effectively alleviating stress of the encapsulation layers and the OLED light emitting layer during bending, to effectively improve the reliability of the flexible display device and improve the chromaticity uniformity of the bending area.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

The subject matter of the present application can be manufactured and used in the industry with industrial applicability.

What is claimed is:

1. A flexible display panel, comprising:
    a flexible substrate;
    a thin film transistor array on the flexible substrate;
    a pixel isolation layer on the thin film transistor array;
    an organic light emitting layer on the pixel isolation layer; and
    a thin film encapsulation layer on the organic light emitting layer,
    wherein the thin film encapsulation layer comprises a first inorganic encapsulation layer, an organic encapsulation layer, and a second inorganic encapsulation layer sequentially stacked in a direction away from the flexible substrate, wherein the organic encapsulation layer comprises a patterned first organic encapsulation layer and a second organic encapsulation layer; and wherein a light emitting unit is disposed in the organic light emitting layer, and the flexible display panel further comprising:

at least one bending area and a planar region, wherein the patterned first organic encapsulation layer is disposed in the bending area and corresponds to the light emitting unit, while the second organic encapsulation layer is disposed in the bending area and the planar region and covers the patterned first organic encapsulation layer, wherein a cross section of the patterned first organic encapsulation layer disposed in the bending area has a regular shape which is vertically symmetrical.

2. The flexible display panel according to claim 1, wherein the cross section of the patterned first organic encapsulation layer is of one of a regular hexagon, a regular octagon, a circle, an ellipse, and a diamond.

3. The flexible display panel of claim 1, wherein an elastic modulus of the patterned first organic encapsulation layer is less than or equal to an elastic modulus of the second organic encapsulation layer.

4. The flexible display panel of claim 1, wherein the organic encapsulation layer further comprises a third organic encapsulation layer disposed in the planar region, and the second inorganic encapsulation layer covers the third organic encapsulation layer, wherein material of the third organic encapsulation layer is different from material of the patterned first organic encapsulation layer, and an elastic modulus of the third organic encapsulation layer is greater than the elastic modulus of the patterned first organic encapsulation layer.

5. The flexible display panel of claim 1, wherein the patterned first organic encapsulation layer and the second organic encapsulation layer are made of a same material.

6. The flexible display panel according to claim 1, wherein the patterned first organic encapsulation layer and the second organic encapsulation layer are made of one of an acrylic series, an epoxy series and a silicone series.

7. The flexible display panel according to claim 1, wherein the patterned first organic encapsulation layers respectively corresponding to two adjacent ones of the light emitting units are connected to each other.

8. The flexible display panel of claim 1, wherein the first inorganic encapsulation layer has a thickness ranging from 0.5 micrometers to 1.5 micrometers.

9. A flexible display device, comprising the flexible display panel of claim 1.

10. A method of preparing a flexible display panel, comprising the following steps:

(a) providing a flexible substrate;

(b) forming a thin film transistor array on the flexible substrate;

(c) forming a pixel defining layer on the thin film transistor array;

(d) forming an organic light emitting layer on the pixel defining layer;

(e) depositing and forming a first inorganic encapsulation layer on the organic light emitting layer;

(f) forming a first organic encapsulation layer on the first inorganic encapsulation layer, and patterning the first organic encapsulation layer, wherein the patterned first organic encapsulation layer is disposed at a bending area of the flexible display panel corresponding to a light emitting unit, wherein the flexible display panel comprises the organic light emitting layer, and the light emitting unit is disposed in the organic light emitting layer;

(g) covering the patterned first organic encapsulation layer and the exposed first inorganic encapsulation layer by a second organic encapsulation layer; and (h) depositing and forming a second inorganic encapsulation layer on the second organic encapsulation layer.

* * * * *